(12) United States Patent
Kirby et al.

(10) Patent No.: US 7,232,754 B2
(45) Date of Patent: Jun. 19, 2007

(54) MICROELECTRONIC DEVICES AND METHODS FOR FORMING INTERCONNECTS IN MICROELECTRONIC DEVICES

(75) Inventors: Kyle K. Kirby, Boise, ID (US); Salman Akram, Boise, ID (US); David R. Hembree, Boise, ID (US); Sidney B. Rigg, Meridian, ID (US); Warren M. Farnworth, Nampa, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 10/879,838

(22) Filed: Jun. 29, 2004

(65) Prior Publication Data

US 2005/0287783 A1    Dec. 29, 2005

(51) Int. Cl.
H01L 21/44    (2006.01)
(52) U.S. Cl. .............................. 438/667; 257/E21.597
(58) Field of Classification Search ................. 438/667
See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 4,959,705 A * | 9/1990 | Lemnios et al. | 257/532 |
| 4,964,212 A * | 10/1990 | Deroux-Dauphin et al. | 29/852 |
| 5,024,966 A * | 6/1991 | Dietrich et al. | 438/23 |
| 5,027,184 A * | 6/1991 | Soclof | 257/506 |
| 5,130,783 A | 7/1992 | McLellan | |
| 5,158,911 A * | 10/1992 | Quentin | 438/125 |
| 5,371,397 A | 12/1994 | Maegawa et al. | |
| 5,424,573 A | 6/1995 | Kato et al. | |
| 5,435,887 A | 7/1995 | Rothschild et al. | |
| 5,447,871 A | 9/1995 | Goldstein | |
| 5,496,755 A * | 3/1996 | Bayraktaroglu | 438/167 |
| 5,505,804 A | 4/1996 | Mizuguchi et al. | |
| 5,593,913 A | 1/1997 | Aoki | |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

*Primary Examiner*—David A. Zarneke
(74) *Attorney, Agent, or Firm*—Perkins Coie LLP

(57) ABSTRACT

Microelectronic devices, methods for packaging microelectronic devices, and methods for forming interconnects in microelectronic devices are disclosed herein. In one embodiment, a method comprises providing a microelectronic substrate having a front side and a backside. The substrate has a microelectronic die including an integrated circuit and a terminal operatively coupled to the integrated circuit. The method also includes forming a passage at least partially through the substrate and having an opening at the front side and/or backside of the substrate. The method further includes sealing the opening with a conductive cap that closes one end of the passage while another end of the passage remains open. The method then includes filling the passage with a conductive material.

41 Claims, 6 Drawing Sheets

U.S. PATENT DOCUMENTS

| | | | |
|---|---|---|---|
| 5,605,783 A | 2/1997 | Revelli et al. | |
| 5,614,743 A * | 3/1997 | Mochizuki | 257/276 |
| 5,627,106 A | 5/1997 | Hsu et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,110,825 A * | 8/2000 | Mastromatteo et al. | 438/667 |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,326,689 B1 * | 12/2001 | Thomas | 257/734 |
| 6,351,027 B1 | 2/2002 | Giboney et al. | |
| 6,372,548 B2 | 4/2002 | Bessho et al. | |
| 6,391,770 B2 * | 5/2002 | Kosaki et al. | 438/650 |
| 6,407,381 B1 | 6/2002 | Glenn et al. | |
| 6,411,439 B2 | 6/2002 | Nishikawa | |
| 6,483,652 B2 | 11/2002 | Nakamura | |
| 6,503,780 B1 | 1/2003 | Glenn et al. | |
| 6,541,762 B2 | 4/2003 | Knag et al. | |
| 6,560,047 B2 | 5/2003 | Choi et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,620,731 B1 | 9/2003 | Farnworth et al. | |
| 6,661,047 B2 | 12/2003 | Rhodes | |
| 6,667,551 B2 * | 12/2003 | Hanaoka et al. | 257/750 |
| 6,670,986 B1 | 12/2003 | Ben Shoshan et al. | |
| 6,686,588 B1 | 2/2004 | Webster et al. | |
| 6,699,787 B2 * | 3/2004 | Mashino et al. | 438/667 |
| 6,703,310 B2 | 3/2004 | Mashino et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,175 B2 * | 12/2004 | Wood et al. | 438/113 |
| 6,828,223 B2 | 12/2004 | Chuang | |
| 6,828,663 B2 | 12/2004 | Chen et al. | |
| 6,828,674 B2 | 12/2004 | Karpman | |
| 6,838,377 B2 * | 1/2005 | Tonami et al. | 438/667 |
| 6,844,978 B2 | 1/2005 | Harden et al. | |
| 6,856,023 B2 | 2/2005 | Muta et al. | |
| 6,864,172 B2 * | 3/2005 | Noma et al. | 438/674 |
| 6,873,054 B2 | 3/2005 | Miyazawa et al. | |
| 6,882,021 B2 | 4/2005 | Boon et al. | |
| 6,885,107 B2 | 4/2005 | Kinsman | |
| 6,903,012 B2 * | 6/2005 | Geefay et al. | 438/667 |
| 6,903,442 B2 * | 6/2005 | Wood et al. | 257/621 |
| 6,916,725 B2 * | 7/2005 | Yamaguchi | 438/459 |
| 6,934,065 B2 | 8/2005 | Kinsman | |
| 6,946,325 B2 | 9/2005 | Yean et al. | |
| 6,953,748 B2 * | 10/2005 | Yamaguchi | 438/667 |
| 6,970,775 B2 * | 11/2005 | Lederle et al. | 701/29 |
| 7,022,609 B2 * | 4/2006 | Yamamoto et al. | 438/694 |
| 7,029,937 B2 * | 4/2006 | Miyazawa | 438/40 |
| 7,045,015 B2 | 5/2006 | Renn et al. | |
| 7,091,124 B2 * | 8/2006 | Rigg et al. | 438/667 |
| 7,094,677 B2 * | 8/2006 | Yamamoto et al. | 438/612 |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2002/0190371 A1 | 12/2002 | Mashino et al. | |
| 2003/0062601 A1 | 4/2003 | Harnden et al. | |
| 2003/0119308 A1 * | 6/2003 | Geefay et al. | 438/640 |
| 2004/0012698 A1 | 1/2004 | Suda et al. | |
| 2004/0023447 A1 | 2/2004 | Hirakata et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0043607 A1 * | 3/2004 | Farnworth et al. | 438/667 |
| 2004/0082094 A1 | 4/2004 | Yamamoto | |
| 2004/0087441 A1 | 5/2004 | Bock et al. | |
| 2004/0137661 A1 | 7/2004 | Murayama | |
| 2004/0137701 A1 * | 7/2004 | Takao | 438/461 |
| 2004/0180539 A1 * | 9/2004 | Yamamoto et al. | 438/667 |
| 2004/0192033 A1 * | 9/2004 | Hara | 438/667 |
| 2004/0214373 A1 | 10/2004 | Jiang et al. | |
| 2004/0245649 A1 | 12/2004 | Imaoka | |
| 2005/0026443 A1 | 2/2005 | Goo et al. | |
| 2005/0052751 A1 | 3/2005 | Liu et al. | |
| 2005/0064707 A1 | 3/2005 | Sinha | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0236708 A1 | 10/2005 | Farnworth et al. | |
| 2005/0254133 A1 | 11/2005 | Akram et al. | |
| 2005/0275750 A1 | 12/2005 | Akram et al. | |
| 2005/0285154 A1 | 12/2005 | Akram et al. | |
| 2006/0043599 A1 | 3/2006 | Akram et al. | |
| 2006/0199363 A1 | 9/2006 | Kirby et al. | |
| 2006/0216862 A1 | 9/2006 | Rigg et al. | |
| 2006/0264041 A1 | 11/2006 | Rigg et al. | |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.

U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microlithography 2002, Mar. 3-8, 2002, Santa Clara, CA.
Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.
DuPont Electronic Materials, Data Sheet, Pyralux PC 2000 Flexible Composites, 4 pages, Oct. 1998, <http://www.dupont.com/fcm>.
Edmund Industrial Optics, Mounted IR Filters, 1 page, retrieved from the Internet on Jun. 30, 2003, <http://www.edmundoptics.com>.
Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.
Hirafune, S. et al., "Packaging Technology for Imager Using Through-hole Interconnection in Si Substrate," Proceeding of HDP'04, IEEE, pp. 303-306, Jul. 2004.
IBM, Zurich Research Laboratory, EPON SU-8 photoresist, 1 page, retrieved from the Internet on Jan. 21, 2003, <http://www.zurich.ibm.com/st/mems/su8.html>.
Intrinsic Viscosity and Its Relation to Intrinsic Conductivity, 9 pages, retrieved from the Internet on Oct. 30, 2003, <http://www.ciks.cbt.nist.gov/-garbocz/paper58/node3.html>.
King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.
Kingpak Technology, Inc. "CMOS Image Sensor Packaging," 1 page, retrieved from the Internet on Aug. 26, 2003, <http://www.kingpak.com/CMOSImager.html>.
Kramer, S.J. et al., "Annual Report—Applications of Supercritical Fluid Technology to Semiconductor Device Processing," pp. 1-29, Nov. 2001.
Kyocera Corporation, Memory Package, 1 page, retrieved from the Internet on Dec. 3, 2004, <http://global.kyocera.com/prdct/semicon/ic_pkg/memory_p.html>.
Lin, Tim (Zhigang) and Rick Yoon, "One Package Technique of Exposed MEMS Sensors," pp. 105-108, 2002 International Symposium on Micro electronics, Sep. 2002.
Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.
Micro Chem, Nano SU-8, Negative Tone Photoresist Formulations 50-100, 4 pages, Feb. 2002, <http://www.microchem.com/products/pdf/SU8_50-100.pdf>.
Optomec, Inc., M3D™ Technology, Maskless Mesoscale Materials Deposition (M3D), 1 page, <http://www.optomec.com/html/m3d.htm>, retrieved from the Internet on Aug. 15, 2003.
Optomec, Inc., M3D™, Maskless Mesoscale™ Materials Deposition, 2 pages, <http://www.optomec.com/downloads/M3DSheet.pdf>, retrieved from the Internet on Jun. 17, 2005.
Photo Vision Systems, Inc., "Advances in Digital Image Sensors," 22 pages, First Annual New York State Conference on Microelectronic Design, Jan. 12, 2002.
Shen, X.-J. et al., "Microplastic embossing process: experimental and theoretical characterizations," Sensors and Actuators, A 97-98 (2002) pp. 428-433, Elsevier Science B.V.
Tapes II International Tape and Fabrication Company, Electronics and Electrical Tapes, 2 pages, 2003, <http://www.tapes2.com/electronics.htm>.
TransChip, 1 page, retrieved from the Internet on Aug. 26, 2003, <http://www.missionventures.com/portfolio/companies/transchip.html>.
TransChip, Inc., CMOS vs CCD, 3 pages, retrieved from the Internet on Dec. 14, 2005, <http://www.transchip.com/content.aspx?id=127>.
TransChip, Inc., Technology, 3 pages, retrieved from the Internet on Dec. 14, 2005, <http://www.transchip.com/content.aspx?id=10>.
UCI Integrated Nanosystems Research Facility, "Cleaning procedures for glass substrates," 3 pages, Fall 1999.
UCI Integrated Nanosystems Research Facility, "Glass Etch Wet Process," 3 pages, Summer 2000.
Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.
Xsil, Via Applications, 1 page, <http://www.xsil.com/viaapplications/index.htm>, retrieved from the Internet on Jul. 22, 2003.
Xsil, Vias for 3D Packaging, 1 page, <http://www.xsil.com/viaapplications/3dpackaging/index.htm>, retrieved from the Internet on Jul. 22, 2003.
Ye, X.R. et al., "Immersion Deposition of Metal Films on Silicon and Germanium Substrates in Supercritical Carbon Dioxide," Chem. Mater. 2003, 15, 83-91.
Yoshida, J. "TransChip rolls out a single-chip CMOS imager," 3 pages, EE Times, Jul. 18, 2003.
U.S. Appl. No. 11/514,568, filed Aug. 31, 2006, inventor Tuttle.
U.S. Appl. No. 11/446,003, filed Jun. 1, 2006, inventor Clark et al.
U.S. Appl. No. 11/511,690, filed Aug. 28, 2006, inventor Borthakur.
U.S. Appl. No. 11/513,661, filed Aug. 30, 2006, inventor Pratt.

* cited by examiner

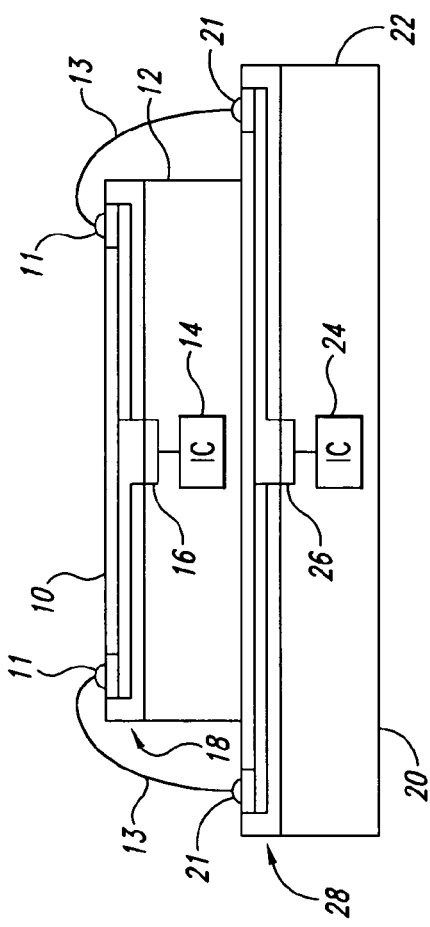
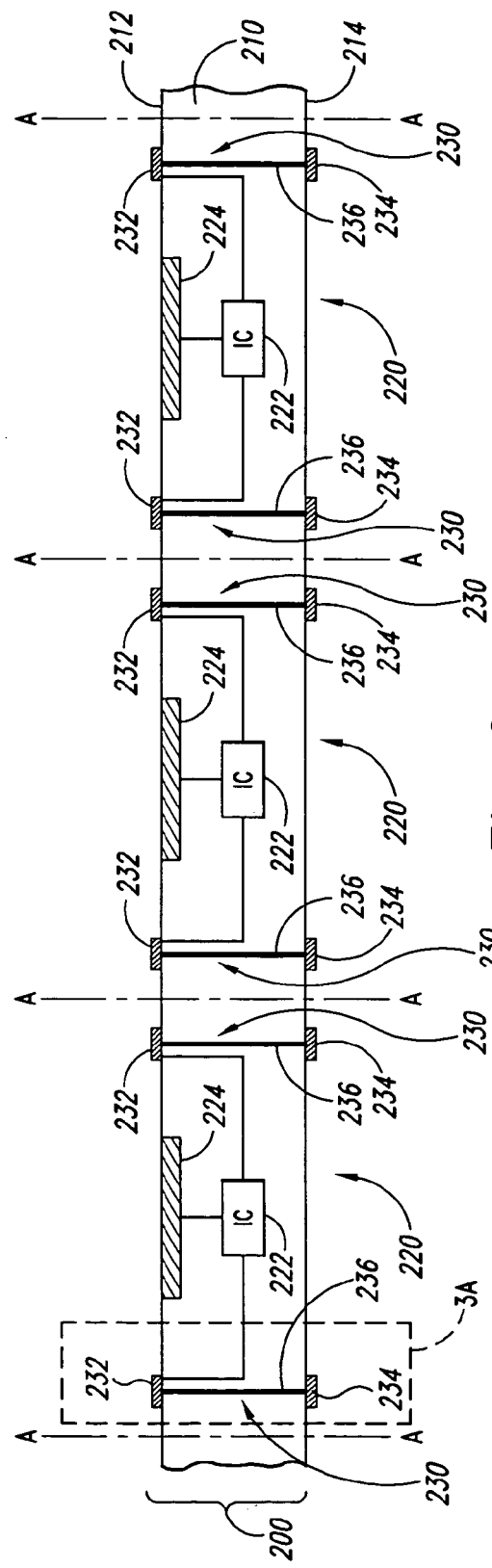

MICROELECTRONIC DEVICES AND METHODS FOR FORMING INTERCONNECTS IN MICROELECTRONIC DEVICES

TECHNICAL FIELD

The following disclosure relates generally to microelectronic devices and, more particularly, to methods for forming interconnects in microelectronic devices.

BACKGROUND

Conventional packaged microelectronic devices can include a singulated microelectronic die, an interposer substrate or lead frame attached to the die, and a molded casing around the die. The die generally includes an integrated circuit and a plurality of bond-pads coupled to the integrated circuit. The bond-pads are typically coupled to terminals on the interposer substrate or lead frame, and supply voltage, signals, etc., are transmitted to and from the integrated circuit via the bond-pads. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

Packaged microelectronic devices such as those described above are used in cellphones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of high performance devices, however, is difficult because the sophisticated integrated circuitry requires more bond-pads, which results in larger ball-grid arrays and thus larger footprints. One technique for increasing the component density of microelectronic devices within a given footprint is to stack one device on top of another.

FIG. 1 schematically illustrates a first microelectronic device 10 attached to a second microelectronic device 20 in a wire-bonded, stacked-die arrangement.

The first microelectronic device 10 includes a die 12 having an integrated circuit 14 electrically coupled to a series of bond-pads 16. A redistribution layer 18 electrically couples a plurality of first solder balls 11 to corresponding bond-pads 16. The second microelectronic device 20 similarly includes a die 22 having an integrated circuit 24 electrically coupled to a series of bond-pads 26. A redistribution layer 28 electrically couples a plurality of second solder balls 21 to corresponding bond-pads 26. Wire-bonds 13 extending from the first solder balls 11 to the second solder balls 21 electrically couple the first microelectronic device 10 to the second microelectronic device 20.

Forming the wire-bonds 13 in the stacked device shown in FIG. 1 can be complex and/or expensive because it requires placing individual wires between corresponding pairs of contacts (e.g., the first solder balls 11 and the second solder balls 21). Further, this type of installation may not be feasible for the high-density, fine-pitch arrays of some high-performance devices because the contacts are not spaced apart far enough to be connected to individual wire-bonds. As such, processes for packaging the dies have become a significant factor in manufacturing microelectronic devices.

To alleviate the problems associated with wire-bonds, Micron Technology, Inc. has developed through-wafer interconnects to electrically couple front side bond-pads with corresponding backside ball-pads. The through-wafer interconnects described in this paragraph are not admitted prior art, but rather they are described to provide background for the invention. Many such through-wafer interconnects are constructed by forming a plurality of holes through a microfeature workpiece. Although the through-wafer interconnects developed to date are quite useful, the open holes in the workpiece may limit certain processing and/or fabrication steps, such as dry etching. For example, the etchant can affect the materials within the holes. Furthermore, the holes through the workpiece do not allow some vacuum chucks to hold the workpiece in place for vapor deposition processes (e.g., chemical vapor deposition (CVD) or physical vapor deposition (PVD)). Therefore, it would be desirable to develop a process for forming through-wafer interconnects that can be used in dry etching processes and held by vacuum chucks.

BRIEF DESCRIPTION OF THE DRAWINGS

FIG. 1 is a side cross-sectional view of a first microelectronic device attached to a second microelectronic device in a stacked-die arrangement in accordance with the prior art.

FIG. 2 is a side cross-sectional view of a microfeature workpiece configured in accordance with an embodiment of the invention.

DETAILED DESCRIPTION

A. Overview

Figure 3A:
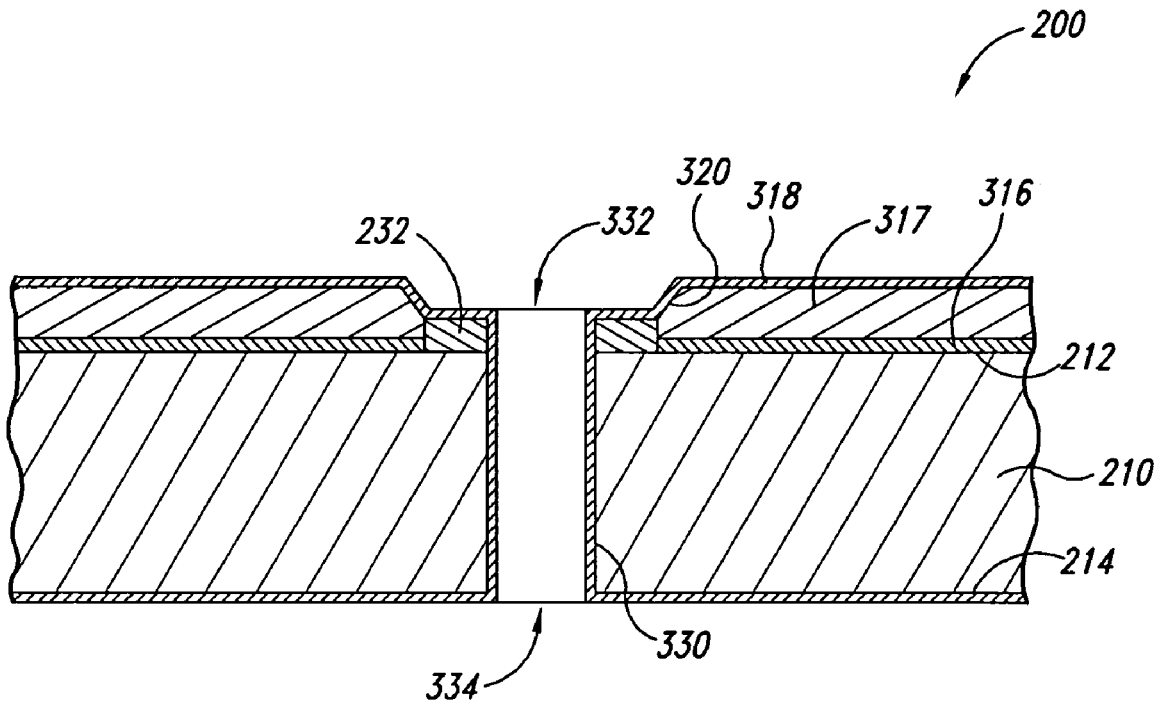
FIGS. 3A–3D are schematic side cross-sectional views illustrating various stages in a method of forming an interconnect in a microelectronic device in accordance with an embodiment of the invention.

The following disclosure describes several embodiments of microelectronic devices and methods for packaging microelectronic devices. One aspect of the invention is directed towards a method for forming an interconnect in a microelectronic device. An embodiment of one such method comprises providing a microelectronic substrate having a front side and a backside. The substrate has a microelectronic die including an integrated circuit and a terminal operatively coupled to the integrated circuit. The method further includes forming a passage at least partially through the substrate and having an opening at the front side and/or the backside of the substrate. The method continues by sealing the opening with a conductive cap that closes one end of the passage while another end of the passage remains open. The method then includes filling the passage with a conductive material.

In one embodiment, sealing the opening of the passage comprises forming a conductive cap in the passage by electrolessly plating metal (e.g., Ni) onto the terminal to occlude the opening. In another embodiment, sealing the opening comprises depositing a gold stud bump in the opening. In a further embodiment, sealing-the opening comprises depositing an aluminum wedge in the passage. In yet another embodiment, sealing the opening comprises depositing a solder ball in the passage.

Another aspect of the invention is directed toward a microelectronic device comprising a microelectronic die having an integrated circuit and a terminal electrically coupled to the integrated circuit. The microelectronic device also includes a passage extending at least partially through the die and having an opening at one end. The microelectronic device further includes a conductive cap in electrical contact with the terminal. The conductive cap occludes the opening without completely filling the passage. In several embodiments, a conductive fill material is deposited in the passage and contacts the conductive cap.

Many specific details of the present invention are described below with reference to semiconductor devices. The term "microfeature workpiece," however, as used throughout this disclosure, includes substrates upon which and/or in which microelectronic devices, micromechanical devices, data storage elements, read/write components, and other features are fabricated. For example, such microelectronic workpieces can include semiconductor wafers (e.g., silicon or gallium arsenide wafers), glass substrates, insulated substrates, and many other types of substrates. The feature sizes in microfeature workpieces can include very small features of 0.11 µm or less, but larger features can also be included on microfeature workpieces.

Specific details of several embodiments of the invention are described below with reference to microelectronic dies and other microelectronic devices in order to provide a thorough understanding of such embodiments. Other details describing well-known structures often associated with microelectronic devices are not set forth in the following description to avoid unnecessarily obscuring the description of the various embodiments. Persons of ordinary skill in the art will understand, however, that the invention may have other embodiments with additional elements or without several of the elements shown and described below with reference to FIGS. 2–5C.

In the Figures, identical reference numbers identify identical or at least generally similar elements. To facilitate the discussion of any particular element, the most significant digit or digits of any reference number refer to the Figure in which that element is first introduced. For example, element 210 is first introduced and discussed with reference to FIG. 2.

B. Embodiments of Microfeature Workpieces

FIG. 2 is a side cross-sectional view of a microfeature workpiece 200 configured in accordance with an embodiment of the invention. In this embodiment, the microfeature workpiece 200 includes a substrate 210 having a front side 212, a backside 214, and a plurality of microelectronic dies 220 formed on and/or in the substrate 210. The individual dies 220 can include an image sensor 224, an integrated circuit 222 operatively coupled to the image sensor 224, and external contacts 230 electrically coupled to the integrated circuit 222. The image sensors 224 can be CMOS or CCD image sensors for capturing pictures or other images in the visible spectrum, but in other embodiments the image sensors 224 can detect radiation in other spectrums (e.g., infrared (IR) or ultraviolet (UV) ranges). The image sensors 224 are typically located at the front side 212 of the substrate 210.

The external contacts 230 shown in FIG. 2 provide a small array of ball-pads within the footprint of each die 220. Each external contact 230, for example, can include a terminal 232 (e.g., a bond-pad), an external contact pad 234 (e.g., a ball-pad), and an interconnect 236 coupling the terminal 232 to the contact pad 234. The contact pads 234 can be connected to other external devices such that the individual dies 220 do not need an interposing substrate to be installed on a circuitboard.

One advantage of using interconnects 236 to electrically couple the terminals 232 to the contact pads 234 is that this eliminates the need for mounting the individual dies 220 to a separate, larger interposer substrate. The individual dies 220 have a significantly smaller footprint and profile than the conventional stacked device shown in FIG. 1. Accordingly, the dies 220 can be used in smaller electronic devices. Furthermore, the interconnects 236 also eliminate having to wire-bond the terminals 232 to external contacts. This is useful because wire-bonds tend to break and are difficult to fabricate on high-density arrays. Accordingly, the microelectronic dies 220 with the interconnects 236 are more robust than dies that require wire-bonds.

In the embodiment illustrated in FIG. 2, the process of forming the interconnects 236 in the microfeature workpiece 200 has been completed. As described below, FIGS. 3A–5C illustrate various embodiments of methods for forming interconnects 236 in the workpiece 200. Although the following description illustrates forming just one interconnect, it will be appreciated that a plurality of interconnects are constructed simultaneously through a plurality of dies on a wafer. After forming the interconnects 236, the microfeature workpiece 200 can be cut along lines A—A to singulate the microelectronic dies 220.

FIGS. 3A–3D illustrate various stages in a method of forming the interconnects 236 in the microfeature workpiece 200 in accordance with an embodiment of the invention. FIG. 3A, more specifically, is a schematic side cross-sectional view of the area 3A shown on FIG. 2 at an intermediate stage of forming the interconnect 236. At this stage, the microfeature workpiece 200 has a first dielectric layer 316 on the front side 212 of the substrate 210 and a second dielectric layer 317 on the first dielectric layer 316. The second dielectric layer 317 has an opening 320 over the terminal 232. The opening 320 can be etched into the second dielectric layer 317 to expose the terminal 232. In one embodiment, the first and second dielectric layers 316 and 317 are a polyimide material, but these dielectric layers can be other nonconductive materials in other embodiments. For example, the first dielectric layer 316 and/or one or more subsequent dielectric layers can be a low temperature chemical vapor deposition (low temperature CVD) material, such as tetraethylorthosilicate (TEOS), parylene, silicon nitride ($Si_3Ni_4$), silicon oxide ($SiO_2$), and/or other suitable materials. The foregoing list of dielectric materials is not exhaustive. In addition, one or more of the dielectric layers described above with reference to FIG. 3A, or described below with reference to subsequent figures, may be omitted.

The workpiece 200 also includes a via or passage 330 extending through the substrate 210 and the terminal 232. The passage 330 includes a first portion 332 defined by the opening 333 at the front side 212 of the substrate 210 and a second portion 334 at the backside 214 of the substrate 210. The passage 330 can be formed using a laser-cutting method at least generally similar to one or more of the methods described in U.S. patent application Ser. No. 10/713,878, entitled "Microelectronic Devices, Methods for Forming Vias in Microelectronic Devices, and Methods for Packaging Microelectronic Devices," filed on Nov. 13, 2003, and incorporated herein in its entirety. In other embodiments, the passage 330 can be formed using other methods, such as a suitable etching or drilling method.

After the passage 330 is formed, a third dielectric layer 318 is applied to the microfeature workpiece 200 to cover the sidewall of the passage 330 in the substrate 210. The third dielectric layer 318 can be applied using CVD, PVD, atomic layer deposition (ALD), or other deposition processes. The third dielectric layer 318 generally completely coats the sidewall of the passage 330, but in some embodiments the third dielectric layer 318 covers only a portion of the sidewall. In the illustrated embodiment, the third dielectric layer 318 is applied to the entire microfeature workpiece 200 so that it covers the exposed portions of the substrate 210, the terminal 232, and the second dielectric layer 317. The third dielectric layer 318 can be a low temperature CVD oxide, but in other embodiments the third dielectric layer 318 can be other suitable dielectric materials as described above. The third dielectric layer 318 electrically insulates the components of the substrate 210 proximate to the passage 330 from conductive material that is subsequently deposited into the passage 330 to form the interconnect 236, as described in greater detail below.

Figure 3B:
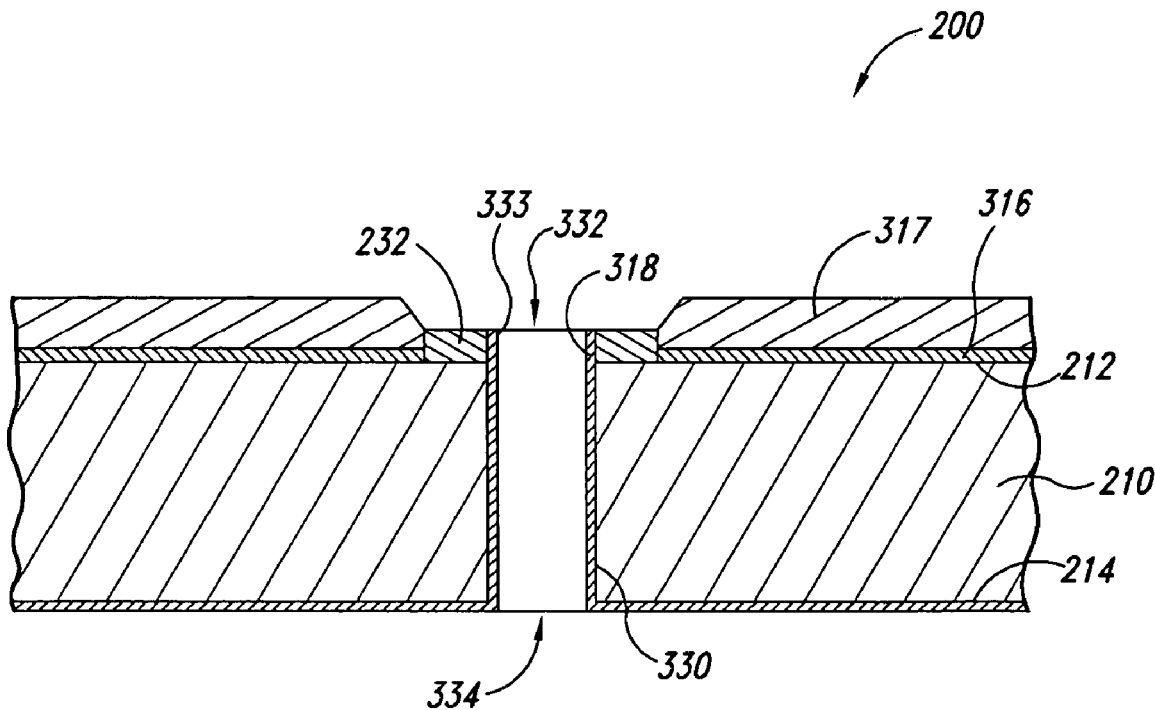

Referring next to FIG. 3B, the method continues by removing portions of the third dielectric layer 318 from the horizontal and diagonal surfaces at the front side 212 of the workpiece 200. In one embodiment, the third dielectric layer 318 is etched using a process that preferentially removes material at a higher etch rate from horizontal surfaces and surfaces having horizontal components relative to the direction of the etchant. Several suitable etching processes are spacer etches. In other embodiments, different processes can be used to selectively remove nonvertical portions of the third dielectric layer 318 so that the vertical portions of the third dielectric layer 318 on the sidewalls in the passage 330 remain on the workpiece 200.

Figure 3C:
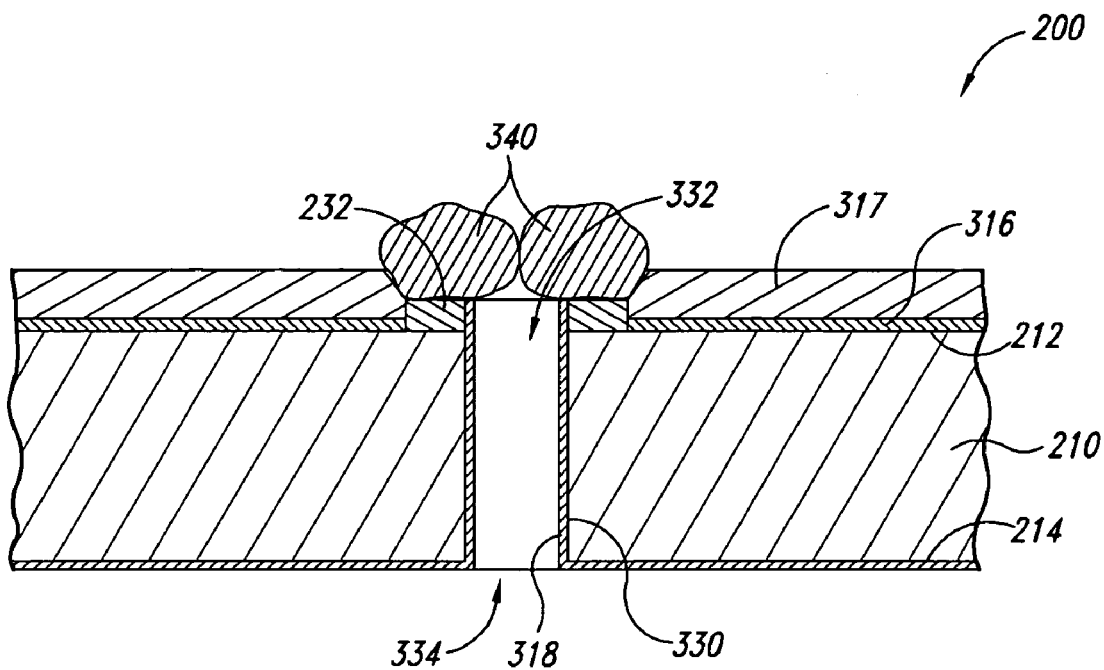

Referring next to FIG. 3C, the method further includes forming a conductive cap 340 at the opening 333 to seal the first portion 332 of the passage 330. In this embodiment, the conductive cap 340 is plated onto the-terminal 232 using an electroless plating process. For example, the conductive cap 340 can be Ni that plates onto the terminal 232 until the first portion 332 of the passage 330 is "pinched-off." The cap 340 seals the first portion 332 of the passage 330. In other embodiments described below, the conductive cap 340 includes other materials and/or is formed using other processes.

Figure 3D:
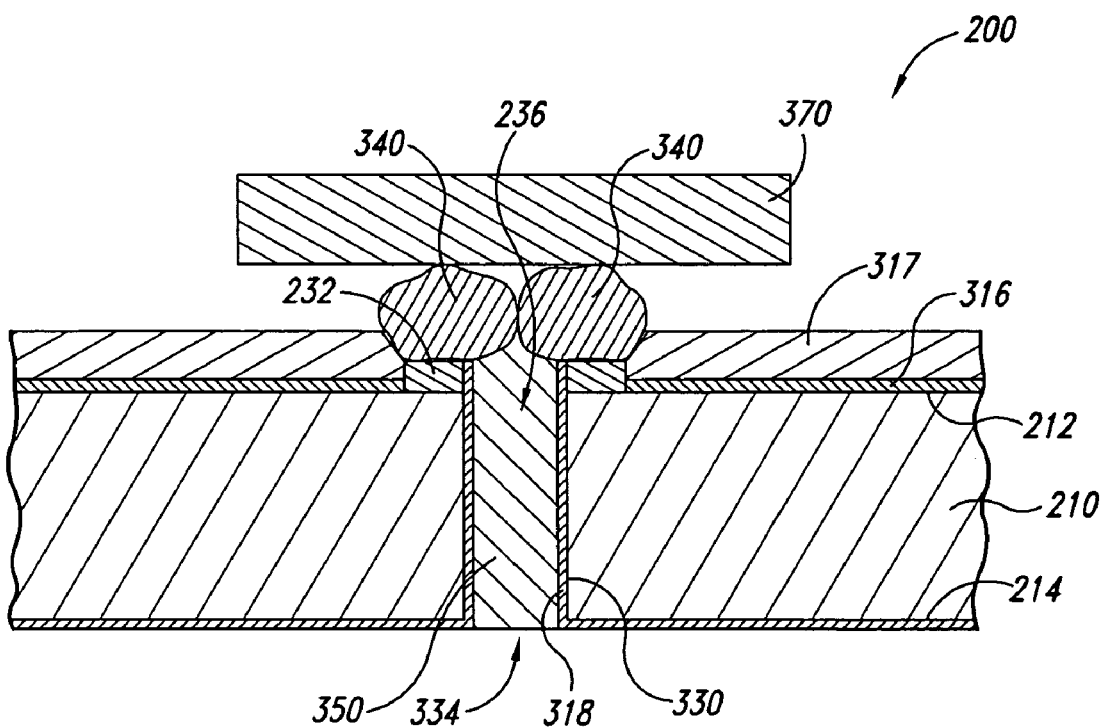

Referring next to FIG. 3D, the method continues by filling at least a portion of the passage 330 with a conductive material 350 to form the interconnect 236. In one embodiment, the fill material 350 is electrolytic nickel, electrolytic copper, electrolytic solder, electroless nickel, electroless copper, conductive polymer paste, molten solder, or other electrically conductive materials. Various processes can be used to deposit the fill material 350 into the passage 330. For example, a conductive element 370 is pressed against the conductive cap 340 and biased at an electrical potential to electroplate the conductive material 350 within the passage 330 in a "bottom-up" plating process. In other embodiments, other methods may be used to bias the conductive cap 340 at an electrical potential suitable for electroplating material into the passage 330, or other methods for filling vias known to those in the art may be used.

The workpiece 200 with the conductive cap 340 has several advantages compared to conventional processes that leave the passage 330 open before depositing the conductive material into the passage 330. One advantage of sealing the passage 330 with the conductive cap 340 is that it allows the workpiece 200 to be releasably secured to a vacuum chuck using suction, which enables the use of chemical-mechanical planarization (CMP) processes. In contrast, it is difficult to secure workpieces with open passages using vacuum chucks.

Another advantage of using the conductive cap 340 to seal the end of the passage 330 is that it protects the passage 330 from other fabrication processes. For example, processes such as dry etching or subsequent film deposition can contaminate and/or damage the passage 330 and the substrate 210. By sealing the passage 330 with the conductive cap 340, contamination or damage to materials within the passage 330 is mitigated.

Yet another advantage of using the conductive cap 340 to seal the passage 330 is that the conductive cap 340 enables bottom-up plating. High-aspect vias, such as the passage 330, are generally very difficult to plate because plating using a conformal seed layer can cause pinch-off and voids. However, the conductive cap 340 in the present embodiment provides bottom-up electroplating for filling the passage 330 with the conductive material 350.

Figure 4A:
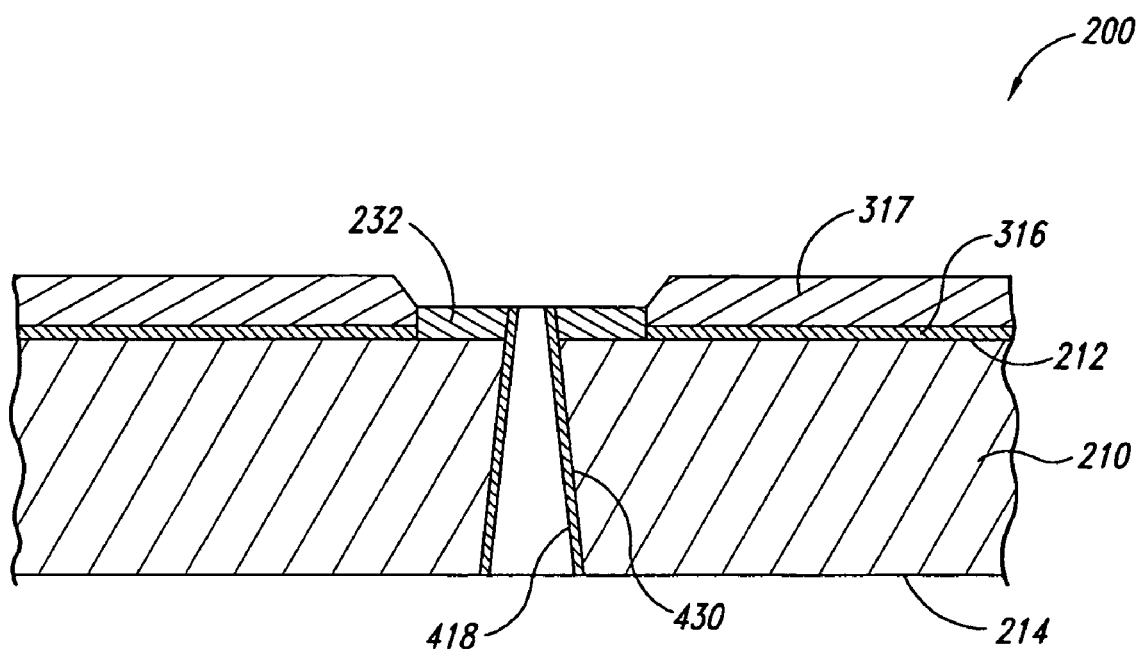
FIG. 4A–4C are schematic side cross-sectional views illustrating various stages in a method of forming an interconnect in a microelectronic device in accordance with another embodiment of the invention.
Figure 4B:
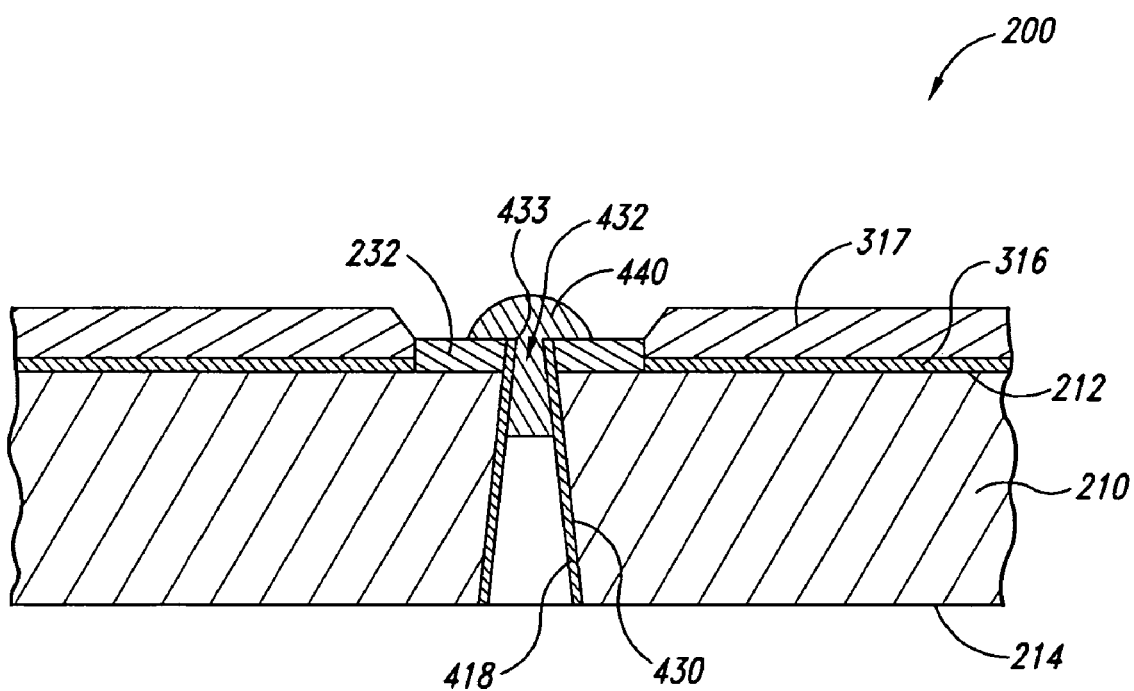
Figure 4C:
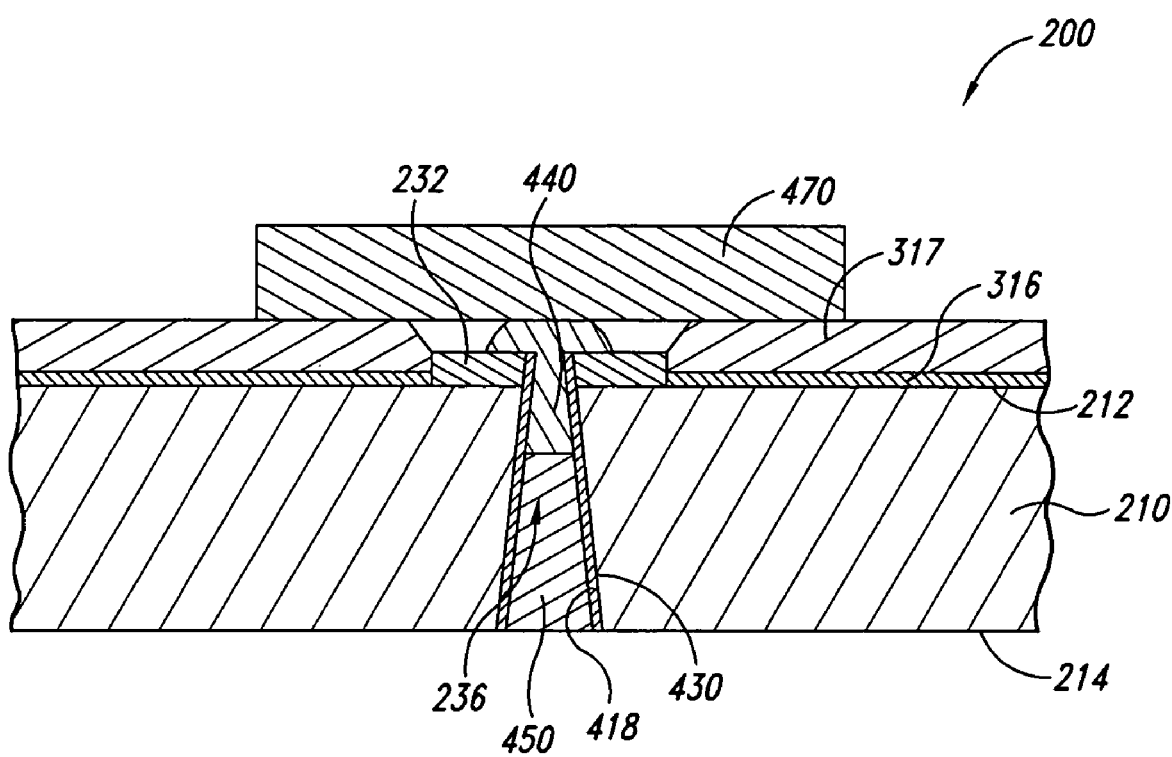

C. Additional Embodiments of Methods for Forming Interconnects in Microfeature Workpieces FIGS. 4A–4C are schematic side cross-sectional views illustrating various stages of a method for forming the interconnect 236 in the microfeature workpiece 200 of FIG. 2 in accordance with another embodiment of the invention. The initial stages of this method are at least generally similar to the steps described above with respect to FIG. 3A; accordingly, like reference numbers refer to like components in FIGS. 3A and 4A.

Referring first to FIG. 4A, the workpiece 200 includes a passage 430 extending through the substrate 210 and the terminal 232. The passage 430 differs from the passage 330 of FIG. 3A in that the passage 430 is slightly tapered. After forming the passage 430, a third dielectric layer 418 is deposited onto the workpiece 200 to cover the sidewall of the passage 430 within the substrate 210. In practice, the third dielectric layer 418 generally covers at least a portion of the terminal 232 and the second dielectric layer 317 in addition to the exposed portion of the substrate 210 in the passage 430. As described above, the third dielectric layer 418 is etched to expose surfaces on the front and back of the workpiece 200 outside the passage 430.

Referring next to FIG. 4B, the method includes forming a conductive cap 440 at a first portion 432 of the passage 430 adjacent to the terminal 232. In this embodiment, for example, the conductive cap 440 is formed by depositing a gold stud bump at an opening 433 in the passage 430 to occlude the first portion 432 of the passage 430. In other embodiments, the conductive cap 440 that seals the first portion 432 of the passage 430 can be formed by depositing an aluminum wedge stud or a solder cap. For example, the solder cap can be formed by depositing a solder ball, solder paste, or a solder preform at the first portion 432 of the passage 430 and then reflowing the solder to form the conductive cap 440. In yet other embodiments, the conductive cap 440 can include other electrically conductive materials, such as copper, palladium, and/or various solders. In still further embodiments, the conductive cap 440 can be formed using an electroplating process as described above with respect to FIG. 3C.

Referring next to FIG. 4C, the method proceeds by filling at least a portion of the passage 430 with a conductive material 450 to form the interconnect 236. In the illustrated embodiment, the fill material 450 is nickel, copper, solder, conductive polymer paste, or other electrically conductive materials. Various processes can be used to deposit the fill material 450 into the passage 430. As with the method described above in FIGS. 3A–3D, for example, a conductive element 470 is pressed against the conductive cap 440 and biased at an electrical potential to electroplate the conductive material 450 within the passage 430. In other embodiments, other deposition methods can be used to bias the conductive cap 440 at an electrical potential suitable for electroplating material into the passage 430. In yet other embodiments, other methods known to those of skill in the art may be used to deposit the fill material 450 into the passage 430.

Figure 5A:
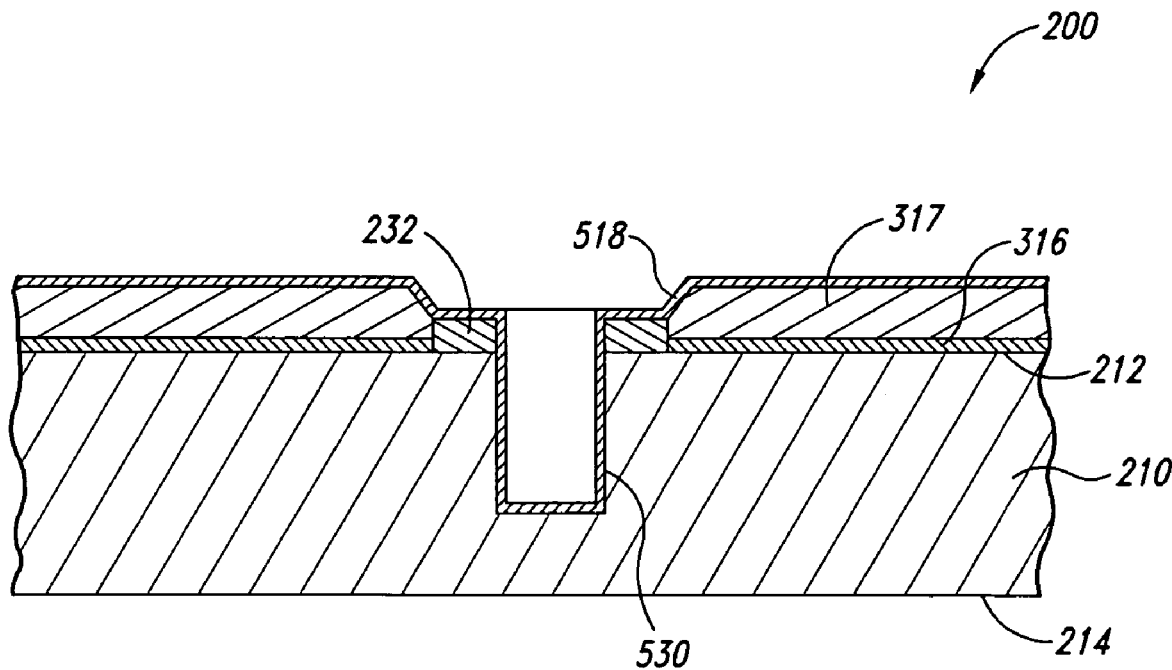
FIGS. 5A–5C are schematic side cross-sectional views illustrating various stages in a method of forming an interconnect in a microelectronic device in accordance with another embodiment of the invention.
Figure 5B:
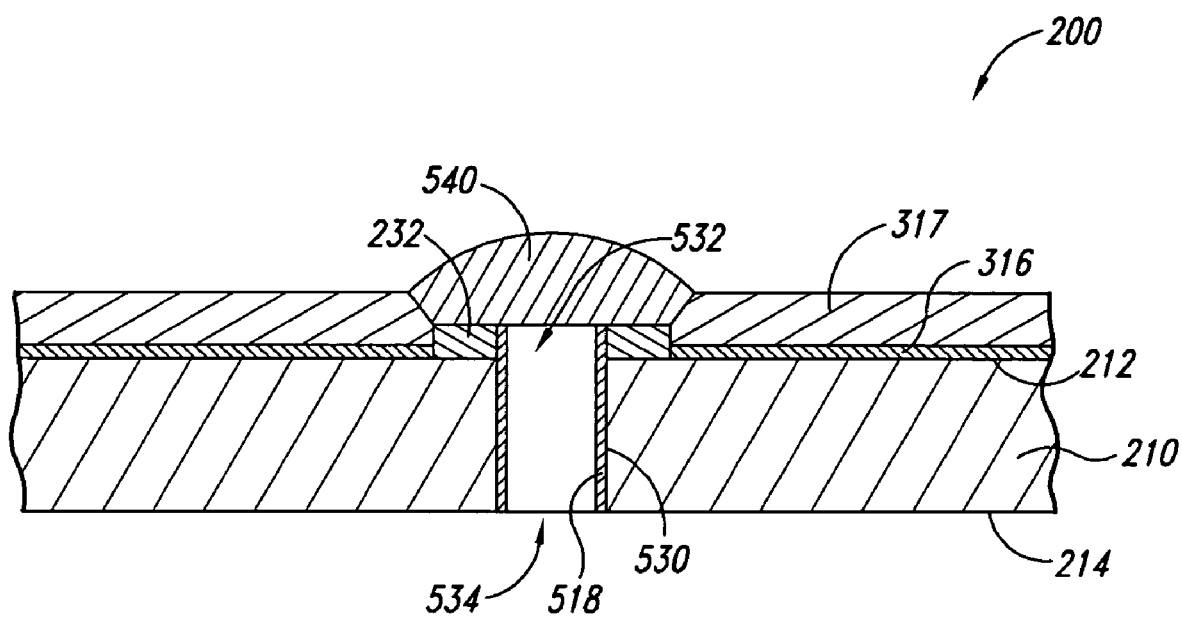
Figure 5C:
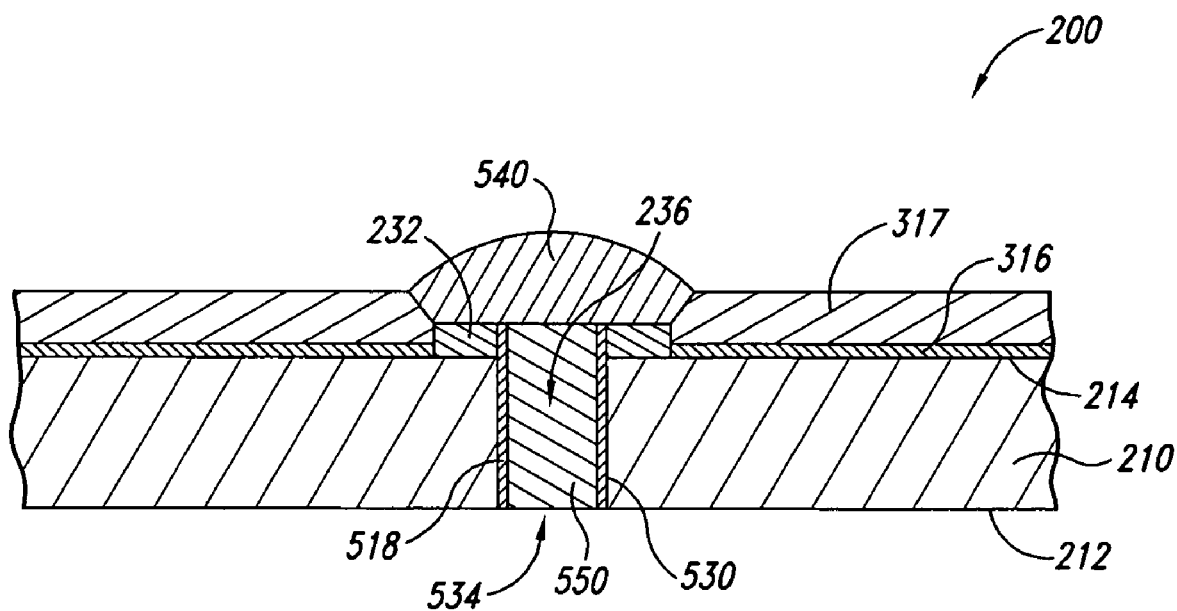

FIGS. 5A–5C are schematic side cross-sectional views illustrating various stages in a method of forming the interconnect 236 in the microfeature workpiece 200 of FIG. 2 in accordance with another embodiment of the invention. The initial stages of this method are at least generally similar to the steps described above with respect to FIG. 3A; accordingly, like reference numbers refer to like components in FIGS. 3A and 5A.

Referring first to FIG. 5A, the workpiece 200 includes a passage 530 extending only partially through the substrate 210. The passage 530 differs from the passage 330 of FIG. 3A in that the passage 530 is a blind hole. As used herein, a "blind hole" refers to a hole or aperture that extends only partially through the substrate 210. In one embodiment, the passage 530 is etched to an intermediate depth within the substrate 210. In other embodiments, the passage 530 may be drilled using a laser or formed using other processes known to those of skill in the art. After the passage 530 is formed, a third dielectric layer 518 is deposited onto the workpiece 200 to cover the sidewalls of the passage 530 in the substrate 210. The third dielectric layer 518 can be one of the materials described above with respect to FIG. 3A. In other embodiments, the third dielectric layer 518 may be formed using other nonconductive materials.

Referring next to FIG. 5B, the method proceeds by forming a conductive cap 540 at a first portion 532 of the passage 530 adjacent to the terminal 232. The conductive cap 540 is formed using any of the materials and processes described above with respect to FIGS. 3C and 4B. After forming the conductive cap 540, the backside 214 of the substrate 210 is thinned to expose a second portion 534 of the passage 530. The backside 214 of the substrate 210 is thinned using CMP processes, dry etching processes, chemical etching, chemical polishing, backgrinding, or other suitable grinding processes known to those of skill in the art.

Referring next to FIG. 5C, after opening the second portion 534 of the passage 530, the remaining portion of the passage 530 is filled with a conductive material 550 to form the interconnect 236 extending through the substrate 210. The fill material 550 can be at least generally similar to the materials described above with respect to FIGS. 3D and 4C. In the illustrated embodiment, the fill material 550 is deposited into the passage 530 using a bottom-up plating process. In other embodiments, different methods known to those of skill in the art may be used to deposit the fill material 550 into the passage 530.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Accordingly, the invention is not limited except as by the appended claims.

We claim:

1. A method of forming an interconnect in a microelectronic device, the method comprising:
   providing a microelectronic substrate having a front side, a backside, and a microelectronic die including an integrated circuit and a terminal operatively coupled to the integrated circuit;
   forming a passage at least partially through the substrate, the passage having an opening at the front side and/or the backside;
   sealing the opening with a conductive cap that closes one end of the passage, wherein another end of the passage remains open; and
   filling the passage with a conductive material.

2. The method of claim 1, further comprising applying a dielectric liner to at least a portion of the passage before forming the conductive cap in the passage.

3. The method of claim 1, further comprising:
   applying a dielectric liner to at least a portion of the passage before forming the conductive cap in the passage;
   positioning a conductive member adjacent to the front side of the substrate and in electrical contact with the conductive cap; and
   electrically biasing the conductive cap at a potential with the conductive member to electroplate the conductive material into the passage.

4. The method of claim 1 wherein:
   forming the passage comprises forming a via extending completely through the substrate and the terminal; and
   sealing the opening comprises forming the cap proximate to the front side of the substrate and in contact with the terminal.

5. The method of claim 1 wherein:
   forming the passage comprises forming a blind hole extending from the front side of the workpiece to an intermediate depth within the substrate; and
   sealing the opening comprises forming the cap proximate to the front side of the workpiece and in contact with the terminal.

6. The method of claim 1 wherein filling the passage with a conductive material comprises constructing an interconnect through the substrate and in contact with the conductive cap.

7. The method of claim 1 wherein sealing the opening comprises forming a conductive cap by electrolessly plating metal onto the terminal to occlude the opening.

8. The method of claim 1 wherein sealing the opening comprises forming a conductive cap by electrolessly plating Ni onto the terminal to occlude the opening.

9. The method of claim 1 wherein sealing the opening comprises forming a conductive cap by depositing a stud bump in the opening.

10. The method of claim 1 wherein sealing the opening comprises forming a conductive cap by depositing a gold stud bump in the opening.

11. The method of claim 1 wherein sealing the opening comprises forming a conductive cap by depositing an aluminum wedge in the opening.

12. The method of claim 1 wherein sealing the opening comprises forming a conductive cap by (a) depositing a solder cap in the opening, the cap including a solder ball, solder paste, and/or solder preform, and (b) reflowing the solder cap.

13. The method of claim 1 wherein forming the passage comprises laser drilling the passage completely through the substrate and the terminal.

14. A method of forming an interconnect in a microelectronic die, the method comprising:
providing a microelectronic substrate having a front side, a backside, and a microelectronic die including an integrated circuit and a terminal at the front side of the substrate operatively coupled to the integrated circuit;
forming a passage extending completely through the substrate and the terminal, the passage having an opening at the terminal;
forming a conductive cap that occludes the opening and is in electrical contact with the terminal; and
constructing an interconnect in at least a portion of the passage and contacting the conductive cap.

15. The method of claim 14, further comprising applying a dielectric liner to at least a portion of the passage before forming the conductive cap in the passage.

16. The method of claim 14, further comprising applying a dielectric liner to at least a portion of the passage before forming the conductive cap in the passage, and wherein constructing the interconnect comprises:
positioning a conductive member adjacent to the front side of the substrate and in electrical contact with the conductive cap; and
electrically biasing the conductive cap at a potential with the conductive member to electroplate the conductive material into the passage.

17. The method of claim 14 wherein forming the conductive cap comprises electrolessly plating metal onto the terminal to seal a portion of the passage.

18. The method of claim 14 wherein forming the conductive cap comprises electrolessly plating Ni onto the terminal to seal a portion of the passage.

19. The method of claim 14 wherein forming the conductive cap comprises depositing a stud bump to seal a portion of the passage.

20. The method of claim 14 wherein forming the conductive cap comprises depositing a gold stud bump to seal a portion of the passage.

21. The method of claim 14 wherein forming the conductive cap comprises depositing an aluminum wedge to seal a portion of the passage.

22. The method of claim 14 wherein forming the conductive cap comprises depositing a solder ball to seal a portion of the passage.

23. The method of claim 14 wherein constructing the interconnect comprises filling the passage with electrolytic nickel, electrolytic copper, electrolytic solder, electroless nickel, electroless copper, conductive polymer paste, and/or molten solder.

24. A method of forming an interconnect in a microelectronic die, the die including a substrate having a front side and a backside, an integrated circuit, and a terminal at the front side of the substrate operatively coupled to the integrated circuit, the method comprising:
forming a passage extending at least partially through the substrate and the terminal, the passage having an opening at the terminal;
occluding the opening with a conductive cap that is in electrical contact with the terminal; and
depositing a conductive fill material into the passage and in contact with the conductive cap.

25. The method of claim 24, further comprising applying a dielectric liner to at least a portion of the passage before occluding the opening with the conductive cap.

26. The method of claim 24 wherein occluding the opening with the conductive cap comprises using an electroless plating technology to seal a portion of the passage.

27. The method of claim 24 wherein occluding the opening with the conductive cap comprises applying Ni in an electroless plating process to seal a portion of the passage.

28. The method of claim 24 wherein occluding the opening with the conductive cap comprises depositing a stud bump to seal a portion of the passage.

29. The method of claim 24 wherein occluding the opening with the conductive cap comprises depositing a gold stud bump to seal a portion of the passage.

30. The method of claim 24 wherein occluding the opening with the conductive cap comprises depositing an aluminum wedge to seal a portion of the passage.

31. The method of claim 24 wherein occluding the opening with the conductive cap comprises depositing a solder ball to seal a portion of the passage.

32. The method of claim 24 wherein depositing the conductive fill material into the passage comprises filling the passage with electrolytic nickel, electrolytic copper, electrolytic solder, electroless nickel, electroless copper, conductive polymer paste, and/or molten solder.

33. A method of manufacturing a microfeature workpiece having a plurality of microelectronic dies, the individual dies including an integrated circuit and a plurality of terminals operatively coupled to the integrated circuit, the method comprising:
forming a plurality of passages extending completely through each die and each terminal;
forming a conductive cap in corresponding passages proximate to a front side of the workpiece and in electrical contact with corresponding terminals; and
depositing a conductive material into the passages and in contact with the conductive caps.

34. The method of claim 33, further comprising lining the passages with a dielectric liner before forming the conductive caps in the passages.

35. The method of claim 33 wherein depositing the conductive fill material into the passages comprises filling at least a portion of each passage with a conductive material using electroplating technology.

36. The method of claim 33 wherein forming the conductive cap comprises depositing a stud bump in each passage.

37. The method of claim 33 wherein forming the conductive cap comprises depositing a gold stud bump in each passage.

38. The method of claim 33 wherein forming the conductive cap comprises depositing an aluminum wedge in each passage.

39. The method of claim 33 wherein forming the conductive cap comprises depositing a solder ball in each passage.

40. The method of claim 33 wherein forming the conductive cap comprises using an electroless plating technology to seal a first end of each passage.

41. The method of claim 33, further comprising singulating the dies from each other.

* * * * *